United States Patent
Takezawa et al.

(10) Patent No.: US 6,814,893 B2
(45) Date of Patent: Nov. 9, 2004

(54) CONDUCTIVE ADHESIVE AGENT, PACKAGING STRUCTURE, AND METHOD FOR MANUFACTURING THE SAME STRUCTURE

(75) Inventors: Hiroaki Takezawa, Nara (JP); Yukihiro Ishimaru, Osaka (JP); Takashi Kitae, Osaka (JP); Tsutomu Mitani, Hyogo (JP); Tousaku Nishiyama, Nara (JP)

(73) Assignee: Matsushita Electric Industiral Co., Ltd., Osaka (JP)

( * ) Notice: Subject to any disclaimer, the term of this patent is extended or adjusted under 35 U.S.C. 154(b) by 0 days.

(21) Appl. No.: 10/613,042

(22) Filed: Jul. 7, 2003

(65) Prior Publication Data
US 2004/0005459 A1 Jan. 8, 2004

Related U.S. Application Data

(63) Continuation of application No. 09/947,353, filed on Sep. 7, 2001, now Pat. No. 6,620,345.

(30) Foreign Application Priority Data

Sep. 7, 2000 (JP) ..................................... P2000-271245

(51) Int. Cl.⁷ .............................. H01B 1/22; C09J 5/00

(52) U.S. Cl. ....................... 252/512; 156/305; 156/327; 438/610

(58) Field of Search ........................... 252/512; 156/305, 156/327; 438/610

(56) References Cited

U.S. PATENT DOCUMENTS

| | | |
|---|---|---|
| 5,853,622 A | 12/1998 | Gallagher et al. |
| 6,132,646 A | 10/2000 | Zhou et al. |
| 6,344,157 B1 | 2/2002 | Cheng et al. |
| 6,458,624 B1 | 10/2002 | Jiang et al. |

FOREIGN PATENT DOCUMENTS

JP        05-242725        9/1993

*Primary Examiner*—Mark Kopec
(74) *Attorney, Agent, or Firm*—McDermott Will & Emery LLP

(57) ABSTRACT

A conductive adhesive agent of the invention contains an elution preventing film-forming agent 4, which becomes reactive after electric continuity through a conductive particle 3 appeared in the conductive adhesive agent when a binder resin 2 is being hardened, to thereby form an elution preventing film 5 on a surface of the conductive particle 3. By using this conductive adhesive agent, the packaging structure is made migration resistant and sulfurization resistant.

7 Claims, 3 Drawing Sheets

F I G. 1A
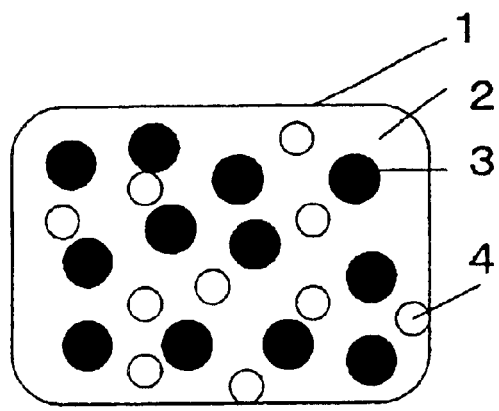
F I G. 1B
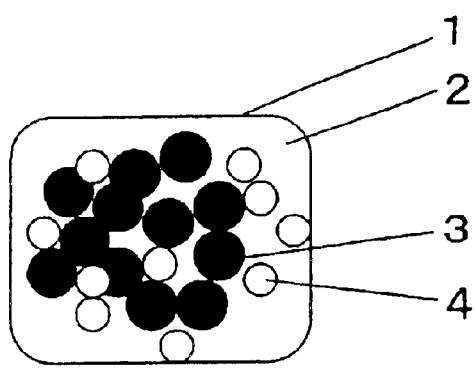
F I G. 1C
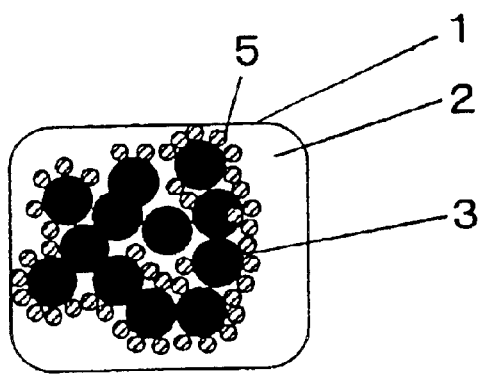

CONDUCTIVE ADHESIVE AGENT, PACKAGING STRUCTURE, AND METHOD FOR MANUFACTURING THE SAME STRUCTURE

This application is a continuation of Ser. No. 09/947,353, filed Sep. 7, 2001, now U.S. Pat. No. 6,620,345.

BACKGROUND OF THE INVENTION

1. Field of the Invention

The invention relates to a conductive adhesive agent used in joining of an electronic element and a printed-circuit board in a field of packaging of the electronic element, a packaging structure using the conductive adhesive agent, and a method for manufacturing the packaging structure.

2. Description of the Related Art

Recently, high consciousness for environmental harmonies has started to restrict use of lead contained in a solder alloy in the field of packaging of electronic devices, thus leading to an emergent need for establishment of technologies of joining electronic elements using a material in which lead is not contained.

As a lead-free packaging technology is known the one using a lead-free solder and a conductive adhesive agent. Recently, however, more and more attention is attracted to a conductive adhesive agent expected to have merits such as flexibility of a joining portion and lower packaging temperature.

A conductive adhesive agent generally has conductive particles dispersed in a resin-based adhesive component. To package a device, first a conductive adhesive agent is applied on a board electrode, the device is attached thereon, and then the resin is hardened. By this process, the joining portions are adhered to each other by the resin and also the conductive particles come in contact with each other as the resin shrinks, thus ensuring continuity at the joint.

The resin of a conductive adhesive agent has a hardening temperature of about 150° C., which is very low as compared to a melting temperature of about 240° C. required for soldering, thus qualifying that agent for use even in packaging of such inexpensive devices that have a low heat resistance.

Also, the joining portions are adhered to each other by a resin, thus being able to flexibly accommodating a deformation due to heat or an external stress. This gives the conductive adhesive agent a merit that the joining portions adhered thereby is not liable to have cracks as compared to those adhered by solder which is an alloy.

For the above reasons, the conductive adhesive agent is expected as an alternative of solder.

Silver, generally used as conductive particles of a conductive adhesive agent, has such a characteristic that it is subject to easy ion migration or sulfurization, problem of which must be solved to put the conductive adhesive agent to practical use as an alternative material for solder.

First, ion migration is described as follows. A phenomenon of ion migration is a sort of electrolytic action, by which dielectric breakdown occurs between electrodes along the following four steps when an electrolyte such as water is present between the electrodes under application of voltage:

Step 1: An anode metal is eluted and ionized;
Step 2: The ionized metal migrates toward a cathode under application of voltage;
Step 3: The metal ions which have migrated to the cathode are precipitated; and
Step 4: Steps 1 through 3 are repeated.

Such a phenomenon of ion migration causes the metal to grow in a tree shape between the electrodes, finally bridging the gap between the electrodes, resulting in dielectric breakdown.

Silver used as a conductive filler of a conductive adhesive agent is easily eluted, thus bringing about ion migration. Further, a recent trend for further reduction in size and weight of electronic equipment has narrowed a pitch between electrodes formed in a semiconductor devices an electronic element or on a printed-circuit board, thus further easily causing ion migration. Taking this into account, the problem of ion migration must be solved indispensably to put to practical use the packaging technology by use of a conductive adhesive agent.

There have conventionally made such three proposals that inhibit ion migration:

Proposal 1: Alloying of conductive filler (e.g., alloying of silver and copper or silver and palladium);
Proposal 2: Sealing of conductive adhesive agent by use of insulating resin such as epoxy resin; and
Proposal 3: Capturing eluted metal ions and rendering them insoluble material by addition of ion capturing agent such as ion exchange resin or chelating agent to conductive adhesive agent.

Those proposals, however, have the following disadvantages. Proposal 1 requires a very expensive filler metal, thus increasing a cost of the conductive adhesive agent. Proposal 2 needs to add an extra step of sealing to thereby increase the number of required steps or greatly expand provisions, thus increasing the manufacturing costs. Proposal 3 causes a metal ion to be eluted from the conductive filler to thereby deteriorate contact-ness of the conductive filler, thus raising the connection resistance.

Thus the above-mentioned proposals have indeed an effect of inhibiting ion migration but also have various problems and so are difficult to put to practical use except in a special application field.

Next, a phenomenon of sulfurization is described as follows. Sulfurization refers to such a phenomenon that a metal reacts with a weal acidic air containing a sulfuric content such as hydrogen sulfide or sulfur dioxide to provide such a material with low conductivity that is called a metal sulfide. Although sulfurization is not know enough yet, it is considered to occur along the following steps:

Step 1: A metal is eluted and ionized in a weak acidic atmosphere; and
Step 2: the metal ions react with sulfur ions to generate a metal sulfide.

As described above, a conductive filler is mainly made up of silver but is liable to be sulfurized, so that when silver is sulfurized, volume-specific resistance of the conductive adhesive agent rises, which is accompanied by a rise in the connection resistance. Few solutions for this problem have been reported so far, so that a packaging structure using a conductive adhesive agent cannot be applied to a product having an electronic element which may be used in such an environment as surroundings of a hot spring or volcano, in which hydrogen sulfide or sulfide dioxide is present at a relatively high concentration. This greatly restrict application fields of the packaging structure using a conductive adhesive agent.

SUMMARY OF THE INVENTION

In view of the above, it is an object of the invention to provide such a packaging structure using a conductive adhesive agent that is capable of maintaining a reliability even under a very humid condition or such a severe condition as a gaseous atmosphere containing sulfur.

To this end, a conductive adhesive agent according to the invention has a binder resin, a conductive particle, and an elution preventing-film forming agent, which forming agent becomes reactive after electrical continuity through the conductive particle is established in this conductive adhesive agent when the binder resin is hardened, thus forming an elution preventing film on the surface of the conductive particle. This causes the following to occur.

When the surface of the conductive particle is coated with the elution preventing film, the conductive particle can be prevented from being eluted even if it is left in a hot and humid environment or in a gas containing sulfur. Therefore, the elution preventing film can prevent ion migration as well as the above-mentioned first step of sulfurization. Thus, the conductive adhesive agent according to the invention can be used to manufacture a packaging structure not liable to encounter ion migration and sulfurization.

When, in this case, the elution preventing film is made of an insulating material and if it is present at a site related to conduction (i.e., contact point between conductive particles and that between a conductive particle and an electrode or the like), it inhibits electrical continuity, thus leading to such a disadvantage that raises a connection resistance of the packaging structure.

By the conductive adhesive agent according to the invention, on the other hand, no elution preventing film is formed on the conductive particle until that adhesive agent is hardened, so that only after the conductive particles come in contact with each other in the process of hardening, the elution preventing film is formed on the particle surface. Accordingly, the elution preventing film is not formed at a site related to continuity, thus avoiding a rise in the connection resistance.

If the above-mentioned requirement of the invention is not met, on the other hand, the object of the invention cannot be realized. That is, when an elution preventing film is formed on the conductive particles before continuity is established, that is, before the agent is hardened, the elution preventing film is already present at a site related to continuity when the conductive adhesive agent is hardened to thereby inhibit electrical continuity, thus raising the connection resistance.

For the conductive adhesive agent according to the invention, preferably the reactive temperature of the elution preventing film-forming agent satisfy the following conditions:

application temperature of conductive adhesive agent<reactive temperature of elution preventing-film forming agent; and reactive temperature of elution preventing film-forming agent≦hardening temperature of binder resin.

When these conditions are established, the following will occur.

No elution preventing film is formed when a conductive adhesive agent according to the invention is applied. When the conductive adhesive agent starts to be heated to its hardening temperature, the elution preventing film-forming agent becomes reactive at a temperature range before the hardening to thereby form an elution preventing film on the conductive particle. At this point in time, the binder resin is not hardened yet so does not inhibit the formation of the elution preventing film. Therefore, the elution preventing film is formed uniformly everywhere on the conductive particle surfaces except on a contact point between the conductive particle and any other conductive substances (any other conductive particles or electrodes). When the elution preventing film is formed and then the conductive adhesive agent is heated up to its hardening temperature, the binder resin is hardened to complete connective fixation by the conductive adhesive agent.

Also, for the conductive adhesive agent according to the invention, the elution preventing film-forming agent contains a chelating agent, which preferably becomes reactive after electrical continuity through the conductive particles is established in this conductive adhesive agent when the binder resin is hardened, thus forming an elution preventing film containing a metallic complex on the conductive particle. Then, the following will occur.

Since the elution preventing film-forming agent contain a chelating agent, an elution preventing film containing a very stable material of metallic complex is formed on the conductive particle. Accordingly, even if a connection site given by the conductive adhesive agent is left in a hot and humid environment or in a gas containing sulfur, the conductive particle is not eluted.

Also, if a metallic complex, which is an insulating material, is present at a site related to continuity (contact point between conductive particles or between a conductive particle and an electrode), the electrical continuity is inhibited, thus raising the connection resistance of the packaging structure. As for a conductive adhesive agent according to the invention, on the other hand, no metallic complex is formed on the conductive particle before the conductive adhesive agent is hardened, so that only after the conductive particles come in contact with each other to establish continuity in the hardening step, the elution preventing film containing the metallic complex is formed on the particles. Thus, the elution preventing film containing a metallic complex is not formed at the site related to continuity, thus avoiding a rise in the connection resistance.

Also, to contain a chelating agent in an elution preventing film-forming agent for the conductive adhesive agent according to the invention, preferably the activation temperature of the chelating agent satisfies the following conditions:

application temperature of conductive adhesive agent<activation temperature of chelating agent; and activation temperature of chelating agent≦hardening temperature of binder resin.

Then, the following will occur.

A chelating agent is a material which selectively reacts with a metal to form a metallic complex, which reaction is most liable to occur at an activation temperature of the chelating agent. Since the activation temperature is higher than an application temperature of the conductive adhesive agent and equal to or lower than a hardening temperature of the binder resin, it reacts with a metal at a temperature therebetween to thereby form an elution preventing film containing the metallic complex on the conductive particles. Therefore, before the conductive adhesive agent is hardened, the chelating agent is dispersed in the conductive adhesive agent, so that an elution preventing film is little formed on the conductive particle. Then, in the hardening step, the chelating agent reacts with the conductive particle to form the elution preventing film containing a metallic complex on the particle surfaces. This elution preventing film provides a protecting film for the conductive particle, thus inhibiting ion migration and sulfurization. Also, the elution preventing film is formed after continuity is established, so that the elution preventing film (metallic complex) is hardly formed at a site related to continuity, thus suppressing a rise in the connection resistance.

An activation temperature (reaction temperature) here refers to a temperature at which a chelating agent and a metal react with each other most frequently, generally coming near the melting temperature. Note here that the relation between the reaction between a chelating agent and a metal and the temperature is nonlinear in that at the activation temperature, the reaction is rapidly activated and at a temperature far distant from that, the reaction occurs little.

An application temperature of the conductive adhesive agent refers to a working temperature at which the conductive adhesive agent is applied on a board electrode by printing or using a dispenser in order to manufacture a packaging structure. The application temperature generally comes near room temperature of 20–40° C. or so.

If as the chelating agent is employed such a material that has an activation temperature higher than the hardening temperature of the binder resin (e.g., bismthyol II having a melting temperature of 246° C. as against a hardening temperature of 150° C.), the chelating agent does not react with the conductive particle even after hardening, so that no metallic complex is formed, thus failing to obtain the effects of resisting against ion migration and sulfurization.

Since the activation temperature is often near the melting temperature, as the chelating agent may be used, for example, an anthranilic acid (melting point: 145° C.), thionylide (217° C.), or pyrogallol (132° C.) as against such a conductive adhesive agent that has an application temperature of 25° C. and a hardening temperature of 150° C.

As for the conductive adhesive agent according to the invention, the elution preventing film-forming agent is encapsulated in a micro-capsule, so that preferably the melting temperature of this micro-capsule and the activation temperature of the chelating agent contained in the elution preventing film-forming agent satisfy the following conditions:

application temperature of conductive adhesive agent<melting temperature of macro-capsule;

melting temperature of micro-capsule≦hardening temperature of binder resin; and activation temperature of chelating agent≦hardening temperature of binder resin.

When those conditions are satisfied, not only the connection resistance of the packaging structure after hardening is inhibited but also more chelating agents can be selected. The reasons are explained below.

In this improvement, a chelating agent as encapsulated in a micro-capsule is added to the conductive adhesive agent to thereby inhibit the reaction of the unhardened chelating agent even more securely. The reasons are described as follows.

By the configuration according to the invention, the activation temperature of the chelating agent is higher than the application temperature of the conductive adhesive agent, so that the reactivity of the chelating agent is low before the binder resin is hardened yet. However, a water content, a hardening agent (amine, acid anhydride, or the like) a residual impurity given in production of a binder resin (chloride, or the like), or the like serves as a reaction accelerator, so that the chelating agent is actually reactive even before hardening, thus forming an elution preventing film containing a metallic complex on the conductive particle surfaces.

As for a conductive adhesive agent according to the invention improved as mentioned above, on the other hand, the chelating agent is protected in a micro-capsule, so that the chelating agent reacts little before the binder agent is hardened. When the binder agent starts to be hardened, the micro-capsule melts to thereby release the chelating agent, which then reacts with the conductive particle to thereby form an elution preventing film containing a metallic complex. Thus, by the invention improved as mentioned above, the elution preventing film (metallic complex) is further less formed before the binder resin is hardened, thus securely inhibiting a rise in the connection resistance in the conductive adhesive agent after hardening. Further, since the activation temperature of the chelating agent may well be lower than the application temperature of the conductive adhesive agent, the required properties (especially activation temperature) of the chelating agent become more lenient, thus enabling selecting more chelating agents that much.

As for the conductive adhesive agent according to the invention, preferably the elution preventing film-forming agent is made up of a water-insoluble material. Then, the following will occur.

Since the elution preventing film, once formed, does not solve out in a hot and humid environment, the in migration resistance is enhanced. The insoluble-ness is here defined that an insolubility (weight soluble in 100 g of water) is less than $1 \times 10^{-5}$ g.

As for a conductive adhesive agent according to the invention, preferably the elution preventing film-forming agent is made up of a material insoluble in a aqueous solution containing a hydrogen sulfide or sulfur oxide. Then, the following will occur. That is, since the elution preventing film, once formed, does not solve out in a weak acid aqueous solution or atmosphere containing sulfur, ion migration resistance and sulfurization resistance are enhanced.

As for a conductive adhesive agent according to the invention, preferably the elution preventing film-forming agent as dispersed in a non-polar solvent is added to this conductive adhesive agent. Then, the following will occur.

Since the non-polar solvent serves to inhibit the reaction of the chelating agent, in the conductive adhesive agent according to the invention improved as mentioned above, the chelating agent is reactive little before the binder resin is hardened. When the binder resin starts to be hardened, the chelating agent reacts with the conductive particle to thereby form an elution preventing film containing a metallic complex. Thus, by the invention improved as mentioned above, the elution preventing film (metallic complex) is formed further less before the binder resin is hardened, thus securely inhibiting a rise in the connection resistance in the conductive adhesive agent. Further, the activation temperature of the chelating agent may well be lower than the application temperature of the conductive adhesive agent, so that the required properties (especially activation temperature) of the chelating agent become more lenient, thus enabling selecting more chelating agents that much.

Also, to achieve the above-mentioned object, the packaging structure according to the invention includes an electric structure and a conductive adhesive agent layer formed on the electric structure in such a configuration that the conductive adhesive agent layer contains conductive particles and is coated with an elution preventing film except a contact point between these conductive particles and between the conductive particle and the electric structure.

This improves the ion migration resistance. This is because the elution preventing film, which provides a protecting film against ion migration, is formed on a necessary portion, that is, a portion except those related to continuity.

A packaging structure has another electric structure disposed on the above-mentioned one, so that these electric structures are electrically interconnected, the conductive adhesive agent layer has a very large effect on the connection resistance because of an ion migration reaction, or the like. To guard against this, the invention is applied to such a configuration so as to have a large effect.

In a packaging structure according to the invention, preferably the elution preventing film s made up of a material containing a metallic complex. Then, the following will occur. That is, since an elution preventing film containing a metallic complex, which is very stable in property, is formed on the conductive particle, the conductive particle does not solve out even if a site connected by the conductive adhesive agent is left in a hot and humid environment or in a gas containing sulfur.

Also, if a metallic complex, which is an insulating material, is at a site related to continuity (contact point between conductive particles or between a conductive particle and an electrode), electrical continuity is deteriorated, thus increasing the connection resistance of the packaging structure. A packaging structure of the invention as improved above, on the other hand, has no metallic complex formed at a site related to continuity, thus avoiding to increase the connection resistance.

In the packaging structure of the invention, preferably the elution preventing film is made up of a water-insoluble material. Then, the elution preventing film once formed dies not solve out even in a hot and humid environment, thus enhancing the ion migration resistance.

In the packaging structure of the invention, preferably the elution preventing film is made up of a material not soluble in an aqueous solution containing hydrogen sulfide or sulfur oxide. Then, the following will occur. That is, the elution preventing film once formed does not solve out even in a weak acid aqueous solution or an atmosphere containing sulfur, thus enhancing the ion migration resistance and the sulfurization resistance.

To manufacture such a packaging structure of the invention as mentioned above, the following two methods are available.

A first method prepares such a conductive adhesive agent that contains a binder resin, a conductive particle, and an elution preventing film-forming agent, a reaction temperature of which elution preventing film-forming agent satisfies the following conditions:

application temperature of conductive adhesive agent<reaction temperature of elution preventing film-forming agent; and reaction temperature of elution preventing film-forming agent≦hardening temperature of binder resin, the method comprising:

a conductive adhesive agent forming step of applying and forming the conductive adhesive agent on the electrode at the application temperature;

an elution preventing film-forming step of heating the conductive adhesive agent up to the hardening temperature and also permitting the elution preventing film-forming agent to react at the reaction temperature before that hardening temperature is reached to thereby form an elution preventing film on the conductive particle; and a hardening step of heating the conductive adhesive agent up to the hardening temperature to harden the binder resin.

A second method prepares such a conductive adhesive agent that contains a binder resin, a conductive particle, and an elution preventing film-forming agent, reaction temperature of which elution preventing film-forming agent satisfies the following conditions:

hardening temperature of binder resin<reaction temperature of elution preventing film-forming agent, the method comprising:

a conductive adhesive agent forming step of forming a layer of the conductive adhesive agent as unhardened on the electrode;

a hardening step of heating the conductive adhesive agent up to the hardening temperature to thereby harden the binder resin; and an elution preventing-film forming step of re-heating the conductive adhesive agent to the reaction temperature or higher to thereby permit the elution preventing film-forming agent to be reactive, thus forming an elution preventing film on the conductive particle.

By those manufacturing methods, the following will occur.

That is, when a conductive adhesive agent according to the invention, no elution preventing film is formed. Then, when the conductive adhesive agent is heated to its hardening temperature, at a temperature before it is hardened, the elution preventing film-forming agent becomes reactive to thereby form an elution preventing film on the conductive particle. At this point in time, the binder resin is not hardened yet, thus avoiding inhibiting the formation of the elution preventing film. Therefore, the elution preventing film is uniformly formed everywhere on the conductive particle surfaces except on a contact point between the conductive particle and any other conductive materials (any other conductive particles or electrodes, or the like). Then, when the hardening temperature of the conductive adhesive agent is reached after the elution preventing film is formed, the binder resin is hardened, thus completing the connection fixation by the conductive adhesive agent.

By the second method, a rise in the connection resistance of the packaging structure can be inhibited further securely. The reason is as follows.

Since the reaction temperature of the elution preventing film-forming agent is higher than the hardening temperature of the binder resin, before the conductive adhesive agent is hardened and when it is being hardened, the elution preventing film-forming agent forms no elution preventing film on the conductive particle surfaces, thus providing good continuity. Then, the binder resin, after being hardened, can be re-heated up to a temperature higher than the reaction temperature of the elution preventing film-forming agent to thereby form an elution preventing film only at a site not related to continuity. Accordingly, the connection resistance of the packaging structure after hardening can be inhibited securely.

Also, preferably the first method prepares the elution preventing film-forming agent which contains a chelating agent, activation temperature of which satisfies the following conditions:

application temperature of conductive adhesive agent<activation temperature of chelating agent; and activation temperature of chelating agent≦hardening temperature of binder resin, during the elution preventing film forming step, the conductive adhesive agent being heated up to the hardening temperature so that at the activation temperature before that temperature is reached the chelating agent is made reactive to thereby form an elution preventing film containing a metallic complex on the conductive particle. Then, the following will occur.

The chelating agent selectively reacts with a metal to form a metal complex, which reaction occurs most at the activation temperature thereof. This improved manufacturing method uses a chelating agent and sets its activation temperature higher than the application temperature of the conductive adhesive agent and not higher than the hardening temperature of the binder resin. Accordingly, the chelating agent becomes reactive at a temperature between the application temperature of the conductive adhesive agent and the hardening temperature of the binder resin to thereby form an elution preventing film containing a metallic complex on the conductive particle. Therefore, before the conductive adhesive agent is hardened, the chelating agent is dispersed in the conducive adhesive agent, thus scarcely forming an elution preventing film on the conductive particle surfaces. When it starts to be hardened, the chelating agent reacts with the conductive particle to form an elution preventing film containing a metallic complex on the particle surfaces. This elution preventing film provides a protecting film for the conductive particle, thus inhibiting ion migration and sulfurization. Also, since the elution preventing film is formed after continuity is established, the elution preventing film (metallic complex) is hardly formed at a site related to continuity, thus suppressing a rise in the connection resistance.

Preferably the second method prepares the elution preventing film-forming agent which contains a chelating agent which has an activation temperature higher than the hardening temperature of the binder resin, in which:

At the hardening step, the binder resin is hardened by a heating process at a temperature lower than the activation temperature; and at the elution preventing film forming step, the conductive adhesive agent is re-heated up to a temperature not less than the activation temperature to act with the chelating agent, thus forming an elution preventing film containing a metallic complex on the conductive particle. Then, it is possible to form the elution preventing film that contains a metallic complex.

Preferably the second method prepares the elution preventing film-forming agent that is encapsulated in a micro-capsule, so that the melting temperature of this micro-capsule and the activation temperature of the chelating agent containing the elution preventing film satisfy the following conditions:

application temperature of conductive adhesive agent<melting temperature of micro-capsule;

melting temperature of micro-capsule≦hardening temperature of binder resin; and activation temperature of chelating agent≦hardening temperature of binder resin, then, a larger number of the conductive adhesive agents can be selected optionally. The reason is as follows.

Since the melting temperature of the micro-capsule is higher than the hardening temperature of the conductive adhesive agent, before the binder resin is hardened or when it is being hardened, the elution preventing film-forming agent does not form an elution preventing film on the conductive particle surfaces, thus providing good continuity. Then, when the binder resin is hardened and re-heated to a temperature higher than the melting temperature of the micro-capsule, an elution preventing film-forming is released from the micro-capsule to thereby form an elution preventing film only at a site not related to continuity. Accordingly, it is possible to more securely lower the connection resistance of the packaging structure after hardening. Also, it is not necessary to set the reaction temperature of the elution preventing film-forming agent at a temperature higher than the hardening temperature of the binder resin, a larger number of the elution preventing film-forming agents can be selected optionally.

Preferably the first and second methods uses such a conductive adhesive agent that the elution preventing film-forming agent is added to this conductive adhesive agent as dispersed in a non-polar solvent. Then, the following will occur.

Since the non-polar solvent serves to inhibit the reaction of the chelating agent, the elution preventing film-forming agent added to the conductive adhesive agent as dispersed in the non-polar solvent causes the chelating agent to be reactive little before the binder resin is hardened. Then, when the binder resin starts to be hardened, the chelating agent reacts with the conductive particle to form an elution preventing film containing a metallic complex. Accordingly, the elution preventing film (metallic complex) is formed further less before the binder resin is hardened, thus securely inhibiting a rise in the connection resistance in the conductive adhesive agent after being hardened. Further, since the activation temperature of the chelating agent may well be not higher than the application temperature of the conductive adhesive agent, the required properties (especially activation temperature) of the chelating agent come lenient, thus increasing the number of the chelating agents that can be used.

In the above-mentioned invention, the following materials can be used.

As the binder resin, almost all resins relatively easily available can be used. For example, as the thermo-hardening resin can be used epoxy resin, phenol resin, urea resin, melamine resin, furan resin, unsaturated-resin polyester resin, di-allyl phthalate resin, silicon resin, or the like. Also, as the thermo-hardening resin can be used vinyl chloride resin, vinylidene chloride resin, polystyrene resin, ionomer, methyl-penten resin, poly-allomer, fluorine resin, a poly-imide, poly-amide, poly-amide-imide, poly-carbonate, modified poly-phenylene oxide, poly-phenylene sulfide.

The micro-capsule may be made of such relatively easily available thermo-hardening resins as vinyl chloride resin, vinylidene chloride resin, polystyrene resin, ionomer, methyl-pentene resin, poly-allomer, fluorine resin, poly-amide, poly-imide, poly-amide-imide, poly-carbonate, modified poly-phenylene oxide, poly-phenylene sulfide, or the like. Note here that the melting temperature of the micro-capsule can be adjusted arbitrarily by adjusting the molar weight of the resin or the film thickness of the micro-capsule.

If the above-mentioned variety of requirements of the conductive adhesive agent and the packaging structure set by the invention are not satisfied, no object of the invention can be realized. The reason is described as follows.

If the melting point of the micro-capsule is not higher than the application temperature of the conductive adhesive agent, the micro-capsule melts before hardening, so that the elution preventing film-forming agent is released, thus forming an elution preventing film on the conductive particle surfaces, thus increasing the connection resistance of the packaging structure after hardening.

If the melting point of the micro-capsule is higher than the hardening temperature, the elution preventing film-forming agent does not react with the conductive particle even after hardening to thereby form no elution preventing film, thus failing to obtain the ion migration resistance nor the sulfurization resistance.

Also, if as the elution preventing film-forming agent added to the conductive adhesive agent is employed such an agent that has as its main component a chelating agent having an activation temperature higher than the hardening temperature (for example, bismthyol II having a melting point of 246° C. as against a hardening temperature of 150° C.), the elution preventing film-forming agent does not react with the conductive particle even after hardening to thereby form no elution preventing film, thus failing to obtain the ion migration resistance nor the sulfurization resistance.

BRIEF DESCRIPTION OF THE DRAWINGS

The above and other objects of the invention will be more apparent from the following description taken in conjunction with the accompanying drawings and described in the accompanying claim. Many advantages of the invention not described in the specification may be apparent to those skilled in the art.

FIG. 1 are expanded diagrams for showing an important part of a conductive adhesive agent according to a first embodiment of the invention, of which FIG. 1A shows a state before hardening, FIG. 1B shows a state where continuity appears during hardening, and FIG. 1C shows a state after hardening;

DETAILED DESCRIPTION OF THE INVENTION

Figure 2:
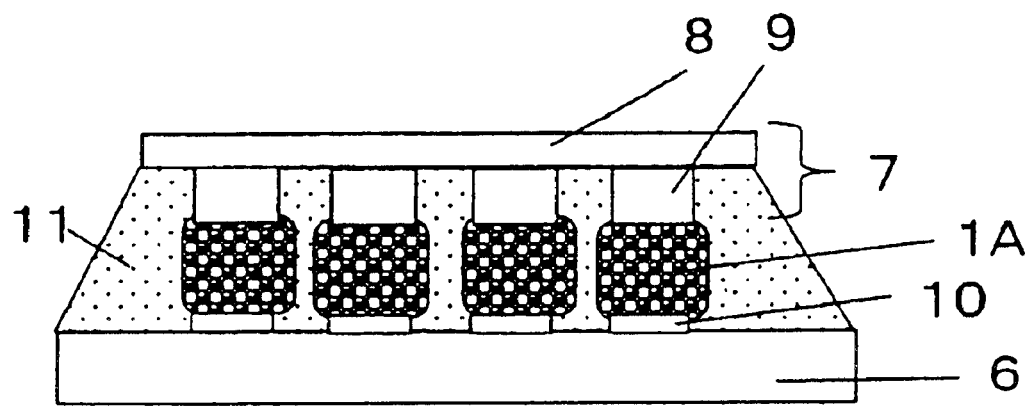
FIG. 2 is a cross-sectional view for showing a flip chip packaging structure according to a second embodiment of the invention.

The following will describe embodiments of the invention with reference to the drawings.

First Preferred Embodiment

This embodiment implements the invention in a conductive adhesive agent. FIGS. 1A–1C are expanded diagrams for showing an important part of the conductive adhesive agent according to this embodiment. FIG. 1A shows a state before being hardened, FIG. 1B shows a state where continuity appeared during its hardening, and FIG. 1C shows a state where it is hardened completely. In FIG. 1A, the conductive adhesive agent 1 comprises a liquid-state binder resin 2 in which are mixed and dispersed a conductive particle 3 and an elution preventing film-forming agent 4 having a chelating agent as its main component. In a hardening step shown in FIG. 1B, the conductive particles 3 are in contact with each other and the elution preventing film-forming agent particles are still dispersed in the binder resin 2 which is half-hardened. In FIG. 1C, the conductive particles 3 are in contact with each other with portions thereof not in contact mutually being coated with an elution preventing film 5 having a metallic complex as its main component in the binder resin 2 which is half-hardened.

As the binder resin 2 the following may be used. That is, as the thermo-hardening resin may be used epoxy resin, phenol resin, urea resin, melanin resin, furan resin, unsaturated-resin polyester resin, diallyl phthalate resin, silicon resin, or the like. Also, as the thermo-plastic resin may be used vinyl chloride resin, vinylydene chloride resin, polystylene resin, ionomer, methyl-penten resin, poly-allomer, fluorine resin, poly-amide, poly-imide, poly-amide-imide, poly-carbonate, modified poly-phenylene oxide, poly-phenylene sulfide, or the like.

As the chelating agent constituting the main component of the elution preventing film-forming agent 4, for example, anthranilic acid (melting point: 143° C.≈activation temperature) or pyrogallol (melting point: 132° C.≈activation temperature) may be used if the conductive adhesive agent has an application temperature of 25° C. and a hardening temperature of 150° C.

Also, as the conductive particle 3, Ag, an alloy of Cu, Cu—, or Ag or an alloy of Cu, Ni, or Ag—Pd coated with Au or Ag may be used. Of these, Ag is preferable taking into account the volume inherent resistance or the material cost.

Second Preferred Embodiment

This embodiment implements the invention in a flip-chip packaging structure for a semiconductor device. As shown in FIG. 2, this packaging structure comprises a printed-circuit board 6, which is one example of the electrical structure, and a semiconductor device 7, which is another example of the electrical structure. The semiconductor device 7 is comprised of an IC substrate 8 and a bump electrode 9 formed on the surface of the IC substrate 8. The printed-circuit board 6 has an I/O terminal electrode 10 on its surface. The I/O terminal electrode 10 has formed thereon a conductive adhesive agent layer 1A made of the conductive adhesive agent 1 described in the first embodiment, through which layer 1A are electrically interconnected the I/O terminal electrode 10 and the bump electrode 9. Further, a sealing resin 11 is provided to fill the gap between the semiconductor device 7 and the printed-circuit board 6, thus constituting the flip-chip packaging structure.

Third Preferred Embodiment

Figure 3:
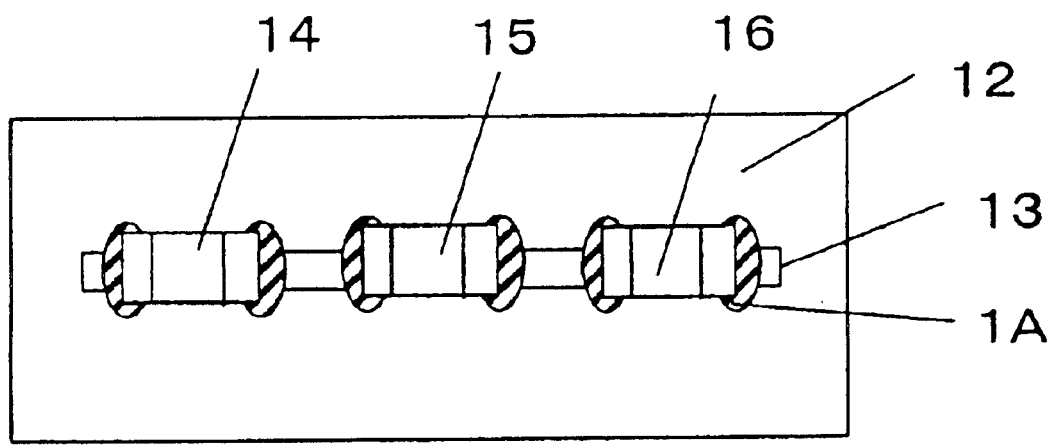
FIG. 3 is a plan view for showing the chip element packaging structure according to a third embodiment of the invention.

This embodiment implements the invention in a packaging structure for a chip element. As shown in FIG. 3, this packaging structure has such a configuration that on the surface thereof are mounted an electrode 13 of a printed-circuit board 12, which is one example of the electrical structure, a chip resistor 14, which is another example of the electrical structure, a chip coil 15, and a chip capacitor 16. The electrode 13 has formed thereon the conductive adhesive agent layer 1A made of the conductive adhesive agent 1 described in the first embodiment, through layer 1A are electrically interconnected the electrode 13 and these chip elements 14, 15, and 16.

Examples of the above-mentioned embodiments are explained below.

First, practical examples (conductive adhesive agent) of the first embodiment are described below.

PRACTICAL EXAMPLE 1

By this practical example, the conductive adhesive agent 1 described in the first embodiment features the elution preventing film-forming agent 4, which is a liquid agent which has as its main component an anthranilic acid (melting point: 143° C.≈activation temperature), which is the chelating agent. The anthranilic acid reacts with an Ag particle to form an anthranilic acid Ag, which is a metallic complex, on the particle surfaces. Note here that the activation temperature (reaction temperature) of the anthranilic acid, the application temperature of the conductive adhesive agent, the hardening temperature of the conductive adhesive agent satisfy the following relations:

application temperature (32° C.) of conductive adhesive agent<activation temperature (143° C.) of anthranilic acid; and activation temperature (143° C.) of anthranilic acid≦hardening temperature (150° C.) of binder resin.

Therefore, the elution preventing film-forming agent 4 containing the anthranilic acid reacts with the conductive particle 3 when the binder resin 2 is hardening, to form the elution preventing film 5 containing the metallic complex. Also, the anthranilic acid Ag, which is a metallic complex formed by this reaction, may be assumed to be non-ionizing and insoluble in water and an aqueous solution containing a hydrogen sulfide or sulfur oxide.

Next, a method of manufacturing the conductive adhesive agent according to this practical example is described as follow. The liquid binder resin 2 (7 weight-%) made of thermo-hardening epoxy resin, the conductive particle 3 (92 weight-%) made of Ag, the elution preventing film-forming agent 4 (2 weight-%) having anthranilic acid as its main component, an addition agent, a dispersion agent, an adherence improver (2 weight-%), and the like are dispersed and mixed using a three-piece roll to provide the conductive adhesive agent 1 of this practical example.

PRACTICAL EXAMPLE 2

As a feature of this practical example, in the configuration of the conductive adhesive agent described in practical example 1, the elution preventing film-forming agent is the elution preventing film-forming agent 4 which has, as its main component, 1-nitroso-2-naphthol (melting point: 110° C.) which serves as the chelating agent employed in place of anthranilic acid. The other conditions are totally the same as those of practical example 1, that is, the configuration conditions of the conductive adhesive agent material, the manufacturing method, the application temperature, the hardening temperature, or the like.

The 1-nitroso-2-naphthol has an activation temperature (reaction temperature≈melting point) of (110° C. or so) and reacts with the conductive particle 3 when the binder resin 2 is being hardened, to form a metallic complex, that is, the elution preventing film 4 which has 1-nitroso-2-naphthol Ag as its main component. The 1-nitroso-2-naphthol Ag is an ionizing material and very easily solved in water and easily absorbs water and an aqueous solution which contains hydrogen sulfide or sulfur oxide.

PRACTICAL EXAMPLE 3

As a feature of this practical example, in the configuration of the conductive adhesive agent described in practical example 1, the elution preventing film-forming agent 4 is given as something obtained by encapsulating a chemical agent having anthranilic acid as its main component in a micro-capsule with hexamethylene phthalamide resin (melting temperature: 87° C.). The other conditions are totally the same as those of practical example 1, that is, the configuration conditions of the conductive adhesive agent material, the manufacturing method, the application temperature, the hardening temperature, or the like. The softening temperature of the micro-capsule, the application temperature of the conductive adhesive agent, and the hardening temperature of the conductive adhesive agent satisfy the following relations:

application temperature of conductive adhesive agent (32° C.)<melting temperature of micro-capsule (87° C.);

melting temperature of micro-capsule (87° C.)≦hardening temperature of binder resin (150° C.); and activation temperature of anthranilic acid (143° C.)≦hardening temperature of binder resin (150° C.).

Therefore, when the binder resin 2 is being hardened, the micro-capsule melts to release the elution preventing film-forming agent 4 from itself, which agent 4 (=anthranilic acid) in turn reacts with the conductive particle 3 to form the elution preventing film 5 containing a metallic complex.

Note here that the elution preventing film-forming agent 4 is encapsulated in the micro-capsule by a publicly known interface polymerization reaction method. The manufacturing method is detailed as follows. Into an aqueous solution of 7.5 ml in which 0.4 M of 1,6-hexamethylene di-amine and 0.45 M of sodium carbonate are solved is added an equivalent amount of water, so that a 15-ml volume of this solvent is subsequently is added to a 75-ml volume of a mixture solution of chloroform and cyclo-hexan (volume ration: 1:4) containing a 5% of anthranilic acid, which is then well stirred and emulsified to provide water/oil type emulsion. After five minutes of emulsification, phthaloyl dichloride is added to the emulsion while stirring it. This causes the condensation polymerization reaction to occur between phthaloyl di-chloride and di-amine on the surface of a water droplet in the emulsion, to produce hexamethylene phthalamide. The above steps causes the elution preventing film-forming agent 4 to be encapsulated in a micro-capsule.

PRACTICAL EXAMPLE 4

As a feature of this practical example, in the configuration of the conductive adhesive agent described in practical example 1, the elution preventing film-forming agent 4 is given as something that has, as its main component, bismthyol II (melting point: 246° C.≈activation temperature) in place of anthranilic acid and also the method includes a step of re-heating at a temperature higher than the activation temperature of the elution preventing film-forming agent 4 after the conductive adhesive agent 1 is hardened. The other conditions are totally the same as those of practical example 1, that is, the configuration conditions of the conductive adhesive agent material, the manufacturing method, the application temperature, the hardening temperature, or the like. The activation temperature of the elution preventing film-forming agent (chelating agent), the hardening temperature of the conductive adhesive agent 1, and the re-heating temperature satisfy the following relations:

hardening temperature of binder resin (150° C.)≦activation temperature of bismthyol II (246° C.); and activation temperature of bismthyol II (246° C.)<re-heating temperature (250° C.).

PRACTICAL EXAMPLE 5

As a feature of this practical example, in the configuration of the conductive adhesive agent described in practical example 4, as the chelating agent constituting the main component of the elution preventing film-forming agent 4, anthranilic acid (activation temperature: 143° C.) is employed in place of bismthyol II and also this elution preventing film-forming agent 4 is encapsulated in a micro-capsule with hexamethylene phthalamide resin (melting temperature: 162° C.). The other conditions are totally the same as those of practical example 1, that is, the configuration conditions of the conductive adhesive agent material, the manufacturing method, the application temperature, the hardening temperature, or the like. The activation temperature (reaction temperature) of the elution preventing film-forming agent 4, the hardening temperature of the conductive adhesive agent 1, the re-heating temperature, and the melting temperature of the capsule satisfy the following relations:

hardening temperature of binder resin (150° C.)<melting temperature of micro-capsule (162° C.);

melting temperature of micro-capsule (162° C.)<re-heating temperature (170° C.); and activation temperature of hexamethylene phthalamide (143° C.)<re-heating temperature (170° C.).

Therefore, the elution preventing film-forming agent 4 stays non-reactive during the hardening step but reacts with the conductive particle at the re-heating step to form the elution preventing film 5 containing a metallic complex.

Corresponding to the above-mentioned practical examples 1–5, the conductive adhesive agent is prepared according to the following comparison examples 1–3.

COMPARISON EXAMPLE 1

The conductive adhesive agent according to this comparison example has such a configuration that he elution preventing film-forming agent 4 is removed from the configuration of a prior art conductive adhesive agent, that is, the conductive adhesive agent 1 of practical example 1, with the content ratio of the conductive particle 3 being the same as practical example 1. That is, this conductive adhesive agent 1 comprises the liquid binder 2 (6 weight-%) made of a thermo-hardening epoxy resin, the conductive particle 3 (92 weight-%) made of Ag, and addition agents (2 weight-%) such as a hardening agent, dispersion agent, or adherence improver, which are dispersed and mixed using a three-piece roll.

COMPARISON EXAMPLE 2

This conductive adhesive agent according to this comparison example has such a configuration that the conductive adhesive agent of practical example 1 contains, as the chelating agent, bismthyol II (melting point: 246° C.≈activation temperature) having an activation temperature higher than the hardening temperature of the conductive adhesive agent. The activation temperature of the chelating agent, the application temperature of the conductive adhesive agent, and the hardening temperature of the conductive adhesive agent satisfy the following conditions:

application temperature of the conductive adhesive agent (32° C.)<hardening temperature of binder resin (150° C.); and hardening temperature of binder resin (150° C.)<activation temperature of bismthyol II (246° C.).

Therefore, in this comparison example 2, the chelating agent stays non-reactive at the hardening step for the binder resin, so that the elution preventing film 5 containing a metallic complex is not formed on the surfaces of the conductive particle 3.

COMPARISON EXAMPLE 3

This conductive adhesive agent has such a configuration that the conductive adhesive agent of practical example 1 contains, as the chelating agent, toluene-3,4-dithiol (melting point: 31° C.≈activation temperature) which has an activation temperature lower than the application temperature of the binder resin 2. The activation temperature of the chelating agent, the application temperature of the conductive adhesive agent, and the hardening temperature of the conductive adhesive agent satisfy the following conditions:

activation temperature of toluene-3,4-dithiol (31° C.)<application temperature of conductive adhesive agent (32° C.); and application temperature of conductive adhesive agent (32° C.)<hardening temperature of binder agent (150° C.).

Therefore, the chelating agent in an unhardened state reacts with the conductive particle to form an elution preventing film containing a metallic complex on the particle surfaces.

The conductive adhesive agent thus prepared according to practical examples 1–5 and comparison examples 1—3 is used to form a conductive adhesive agent layer for evaluation and measurement as follows.

Evaluation of Ion Migration Resistance (Water Droplet Drop Test)

Figure 4:
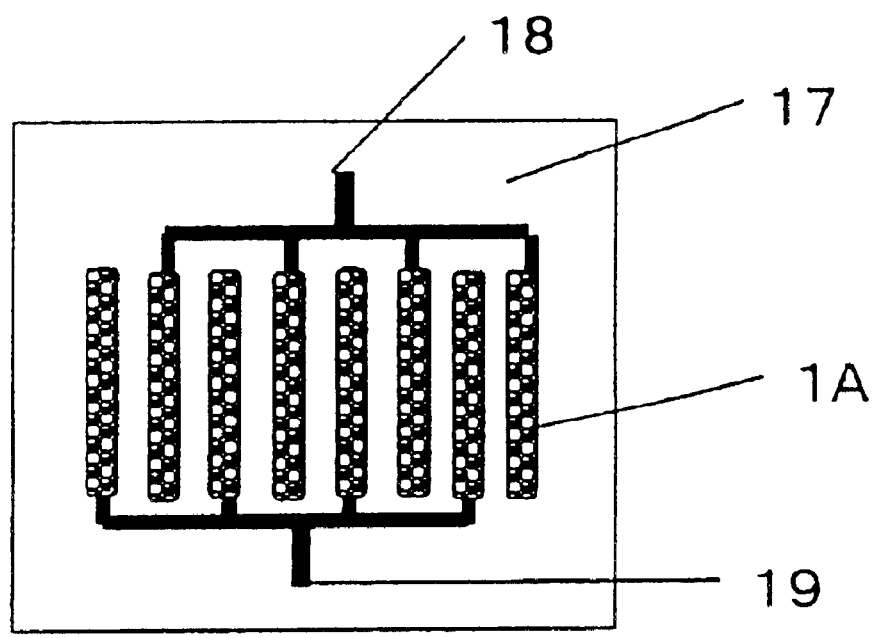
FIG. 4 is a plan view for showing a printed-circuit board used in evaluation of ion migration resistance.

A water droplet drop test is a method for evaluating the ion migration resistance of a material rapidly and simply. The testing method is detailed as follows. As shown in FIG. 4, as a testing sample, comb-shaped conductive adhesive agent layers 18 and 19 are formed on a ceramic-made testing substrate 17 by a screen printing method. The conductive adhesive agent layers 18 and 19 are separated from each other by a predetermined inter-electrode distance (400 μm) and arranged as opposed so that their tips may alternate, with no current generally flowing therebetween.

Deionized water is dropped on thus formed conductive adhesive agent layers 18 and 19 and a DC voltage (1 V) is applied therebetween. Then, a time lapse is measured which elapses from a time point of short-circuiting between the conductive adhesive agent layers 18 and 19 up to a time point that a current starts to flow, so that the ion migration resistance is measured on the basis of that short-circuiting time lapse.

Evaluation of Sulfurization Resistance

Figure 5:
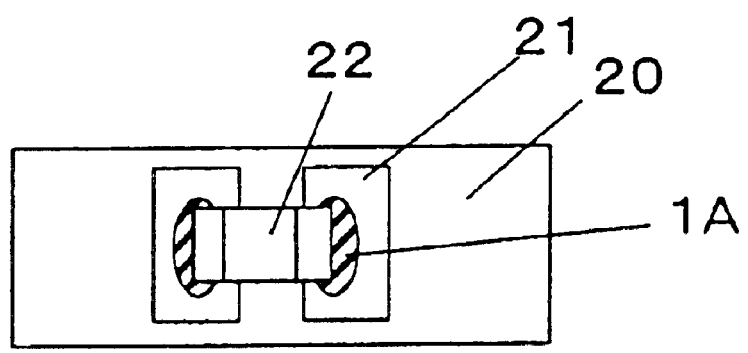
FIG. 5 is a plan view for showing a testing sample used in evaluation of sulfurization resistance.

As shown in FIG. 5, on a glass epoxy-made testing board 20, a gold-plated electrode 21 is formed, on which is in turn formed a conductive adhesive agent layer 1A made of the conductive adhesive agent 1 by the screen printing method. On the conductive adhesive agent layer 1A is then mounted a 3216-size 0-Ω resistor (terminal plating: SnPb solder) 22 using a mount packaging machine. Next, to harden the conductive adhesive agent layer 1A, it is heated in an oven at 150° C. for 30 minutes. Thus prepared samples are measured for the initial connection resistance and then left in an enclosed bath filled with hydrogen sulfide to thereby measure a change in the connection resistance, thus evaluating the sulfurization resistance. The testing conditions includes a temperature of 40° C., a humidity of 90%, a concentration of the hydrogen sulfide of 3 ppm, and a testing time of 96 hours.

The results of the above-mentioned evaluation and measurements are summarized in Table 1. Note here that the conductive adhesive agent was applied in all the tests at an application temperature (working temperature) of 32° C.

TABLE 1

| | Chelating agent (Activation temperature) | Capsule (Softening temperature) | Metallic complex Solubility | Re-heating | Migration Test results | Sulfurization test results Initial value-> value after 96 H |
|---|---|---|---|---|---|---|
| Embodiment 1 | Anthranilic acid (143 ° C.) | None | Insoluble | None | 965 sec | 42 mΩ -> 42 mΩ |

TABLE 1-continued

| | Chelating agent (Activation temperature) | Capsule (Softening temperature) | Metallic complex Solubility | Re-heating | Migration Test results | Sulfurization test results Initial value-> value after 96 H |
|---|---|---|---|---|---|---|
| Embodiment 2 | 1-nitroso-2-naphthaol (110° C.) | None | Soluble | None | 842 sec | 42 mΩ -> 45 mΩ |
| Embodiment 3 | Anthranilic acid (143° C.) | HMFA (87° C.) | Insoluble | None | 970 sec | 38 mΩ -> 38 mΩ |
| Embodiment 4 | Bismthyol II (246° C.) | None | Insoluble | 250° C. 5 min | 960 sec | 35 mΩ -> 35mΩ |
| Embodiment 5 | Anthranilic acid (143° C.) | HMFA (162° C.) | Insoluble | 170° C. 5 min | 963 sec | 35 mΩ -> 35 mΩ |
| Comparison example 1 | None | None | — | None | 86 sec | 35 mΩ -> 98 mΩ |
| Comparison example 2 | Toluene-3,4-dithiol (31° C.) | None | Insoluble | None | 964 sec | 126 mΩ -> 126 mΩ |
| Comparison example 3 | Bismthyol II (246° C.) | None | Insoluble | None | 86 sec | 36 mΩ -> 101 mΩ |

*HMFA: Hexamethylene phthalamide

Comparison of the conductive adhesive agents according to practical examples 1–5 to comparison examples 1–3 shows the following. That is, the evaluation of the ion migration resistance indicates that the time lapse up to a point in time when a current starts to flow was prolonged as compared to the case of using the prior art conductive adhesive agent (comparison example 1) so it is confirmed that the ion migration resistance was improved. Also, the evaluation of the sulfurization indicates that a ratio of a change in the connection resistance as measured before and after testing was reduced as compared to comparison example 1 so it is confirmed that the sulfurization resistance was improved.

Further, the comparison assures the following. That is, comparison between practical example 1 where the metallic complex constituting the main component of the elution preventing film 5 formed on the surfaces of the conductive particle 3 is insoluble in water and an aqueous solution containing hydrogen sulfide or sulfur oxide and practical example 2 where it is soluble in water reveals that practical example 1 came up with better ion migration resistance and sulfurization resistance. This is considered because the elution preventing film (metallic complex) formed, if it is insoluble in water and an aqueous solution containing hydrogen sulfide or sulfur oxide, is less subject to flake-off even when the water or the aqueous solution containing sulfur is condensed on the surfaces of the film.

Comparison between practical example 1 where the elution preventing film-forming agent 4 (chelating agent) is added as it is into the conductive adhesive agent 1 and practical example 3 where it is added as encapsulated in a micro-capsule reveals that practical example 3 came up with a lower initial connection resistance. This is considered because when it is encapsulated in the micro-capsule, the reaction of the elution preventing film-forming agent 4 as unhardened can be more surely inhibited, thus reducing the amount of the insulating elution preventing film 5 (metallic complex) which exists at a contact point between the conductive particles 3 or the conductive particle 3 and the electrode 13 or 21. Note here that although in practical example 3 the elution preventing film-forming agent 4 which has, as its main component, anthranilic acid having an activation temperature higher than the application temperature of the conductive adhesive agent 1 is encapsulated in a micro-capsule, the elution preventing film-forming agent 4 can have, as its main component, such a chelating agent that has an activation temperature lower than the application temperature of the conductive adhesive agent 1, thus extending the range of selectable elution preventing film-forming agents (chelating agents) as compared to practical example 1.

Comparison between practical example 1 using the elution preventing film-forming agent 4 having as its main. component such a chelating agent that becomes reactive at a hardening step of the conductive adhesive agent 1 and practical example 4 using the elution preventing film-forming agent 4 having as its main component such a chelating agent that does not become reactive at the hardening step so that the elution preventing film-forming agent 4 may become reactive at the re-heating step after the hardening step reveals that practical example 4 came up with a lower initial connection resistance, almost equal to an initial value obtained in the case (comparison example 1) where the prior art conductive adhesive agent was used. This is considered because that in practical example 4 the elution preventing film 4 becomes reactive in formation after continuity appeared at the hardening step, so that the elution preventing film 5 is formed little at a continuity site.

As may be clear from practical example 5, when the elution preventing film-forming agent 4 is encapsulated in a micro-capsule in practical example 4, almost the same ion migration resistance and sulfurization resistance can be obtained and, in addition to that, the range of selectable elution preventing film-forming agent 4 is extended. This is because practical example 4 needs to use the elution preventing film-forming agent 4 containing such a chelating agent that has an activation temperature (reaction temperature) higher than the hardening temperature, whereas practical example 5 can accept any activation temperature of the elution preventing film-forming agent 4 as far as the melting temperature of the micro-capsule is set higher than the hardening temperature of the binder resin 2. For example, it is possible to use even such an elution preventing film-forming agent 4 that has an activation temperature lower than the application temperature of the conductive adhesive agent 1.

Note here that if the conditions described in practical examples 1–5 are not satisfied, the intended effects cannot be obtained. The evidence is given in comparison examples 2 and 3.

Comparison example 2 indicates a case of using such an elution preventing film-forming agent 4 that has, as its main component, a chelating agent having an activation temperature lower than the application temperature of the conductive adhesive agent 1. This case came up with an extremely high initial connection resistance as compared to practical example 1, that is, a case where the activation temperature is higher than the application temperature. This is because that the elution preventing film-forming agent 4 reacts as unhardened with the conductive particle 3 to form the elution preventing film 5 (metallic complex), so that an insulating elution preventing film 5 (metallic complex) is present at a site related to continuity of the conductive particles 3, thus increasing the contact resistance.

Also, comparison example 3 indicates a case of using such an elution preventing film-forming agent 4 that has, as its main component, a chelating agent having an activation temperature higher than the hardening temperature of the conductive adhesive agent 1. Comparison example 3 came up with such a result that the ion migration resistance and the sulfurization resistance were extremely inferior as compared to practical example 1, that is, a case where the activation temperature of the chelating agent is lower than the hardening temperature. This is because that the elution preventing film-forming agent 4 is not reactive at the hardening step for the conductive adhesive agent 1 (binder resin 2), thus failing to form the elution preventing film (metallic complex) 4 on the surfaces of the conductive particle 3.

Next, the practical examples of the second preferred embodiment (flip chip packaging structure for semiconductor device) are described as follows.

PRACTICAL EXAMPLE 6

As a feature of this practical example, as the elution preventing film-forming agent 4, the conductive adhesive agent of practical example 1 using, as its man component, anthranilic acid, which is a chelating agent (except that a thermoplastic epoxy resin is used as the liquid binder resin 2), is used to flip-chip package the semiconductor device 7 on the printed-circuit board 6. That is, the conductive adhesive agent 1 described in practical example 1 is transferred by a publicly known method onto the bump electrode 9 of the semiconductor device 7. Then, with thus transferred conductive adhesive agent 1 as aligned with the I/O terminal electrode 10 of the printed-circuit board 6, the semiconductor device 7 is flip-chip packaged on the printed-circuit board 6. Then, after the conductive adhesive agent 1 is hardened, an electrical test is performed to then harden the sealing resin 11 made of thermo-hardening epoxy resin supplied between the printed-circuit board 6 and the semiconductor device 7 which came up with good results of testing, to thereby seal the related jointed site, thus providing a flip chip packaging structure.

PRACTICAL EXAMPLE 7

As a feature of this practical example, as the elution preventing film-forming agent 4, the conductive adhesive agent 1 of practical example 2 having, as its main component, 1-nitroso-2-naphthol, which is a chelating agent, is used to constitute the flip chip packaging structure. The configuration and the manufacturing method of the flip chip packaging structure are totally the same as those of practical example 6 except the conductive adhesive agent employed.

PRACTICAL EXAMPLE 8

As a feature of this practical example, as the elution preventing film-forming agent 4, such a material that has, as its main component, anthranilic acid, which is a chelating agent, is used and, at the same time, the conductive adhesive agent 1 of practical example 3 for encapsulating this elution preventing film-forming agent 4 in a micro-capsule with a hexamethylene phtalamide resin is used to constitute the flip chip packaging structure. The configuration and the manufacturing method of the flip chip packaging structure are totally the same as those of practical example 6 except the conductive adhesive agent 1 employed.

PRACTICAL EXAMPLE 9

As a feature of this practical example, as the elution preventing film-forming agent 4, the conductive adhesive agent 1 having, as its main component, the bismthyol II, which is a chelating agent, is hardened and then undergoes re-heating according to the method of practical example 4, to constitute the flip chip packaging structure. The configuration and the manufacturing method of the flip chip packaging structure are totally the same as those of practical example 6 except the conductive adhesive agent employed.

PRACTICAL EXAMPLE 10

As a feature of this practical example, as the elution preventing film-forming agent 4, such a material that has, as its main component, anthranilic acid, which is a chelating agent, and also that encapsulates this elution preventing film-forming agent 4 in a micro-capsule with a hexamethylene phtalamide resin is used and then undergoes re-heating after the conductive adhesive agent 1 is hardened according to the method of practical example 5, to form the flip chip packaging structure. The configuration and the manufacturing method of the flip chip packaging structure are totally the same as those of practical example 6 except the conductive adhesive agent 1 employed.

COMPARISON EXAMPLES 4–6

Corresponding to the above-mentioned practical examples 6–10, the flip chip packaging structures of comparison examples 4–6 are prepared.

These flip chip packaging structures are supposed to use the conductive adhesive agent of comparison example 1 and also have the same packaging constructions as those of practical examples 6–10.

Thus prepared flip chip packaging structures of practical examples 6–10 and comparison examples 4–6 are evaluated in terms of reliability according to the following method.

That is, as flowing an in-actual-use current (10 mA) through these flip chip packaging structures, the method. measured them for a change in the connection resistance in a hot and humid environment (temperature: 85° C., humidity: 85%, testing time 1000 hours), to perform evaluation and measurement of the ion migration resistance. Likewise, as flowing an in-actual-use current (10 mA) through them, the method measured them for a change in the connection resistance in a hydrogen sulfide atmosphere (temperature: 40° C., humidity: 90%, concentration of hydrogen sulfide: 3 ppm, testing time: 96 hours), to perform evaluation and measurement of the sulfurization resistance. The results are shown in Table 2.

TABLE 2

| | Chelating agent (Activation temperature) | Capsule (Softening temperature) | Metallic complex Solubility | Re-heating | Migration results Initial value –> value after 1000 H | Sulfurization test results Initial value –> value after 96 H |
|---|---|---|---|---|---|---|
| Embodiment 6 | Anthranilic acid (143° C.) | None | Insoluble | None | 21 mΩ –> 21mΩ | 21 mΩ –> 21mΩ |
| Embodiment 7 | 1-nitroso-2-naphthaol (110° C.) | None | Soluble | None | 21 mΩ –> 27 mΩ | 21 mΩ–> 23 mΩ |
| Embodiment 8 | Anthranilic acid (143° C.) | HMFA (87° C.) | Insoluble | None | 19 mΩ –> 19 mΩ | 19 mΩ –> 19 mΩ |
| Embodiment 9 | Bismthyol II (246° C.) | None | Insoluble | 250° C. 5 min | 17 mΩ –> 17 mΩ | 17 mΩ–> 17 mΩ |
| Embodiment 10 | Anthranilic acid (143° C.) | HMFA (162° C.) | Insoluble | 170° C. 5 min | 17 mΩ –> 17mΩ | 17 mΩ –> 17 mΩ |
| Comparison example 4 | None | None | — | None | 17 mΩ –> OPEN | 17 mΩ –> 50 mΩ |
| Comparison example 5 | Toluene-3,4-dithiol (31° C.) | None | Insoluble | None | 1.5 Ω –> 1.5 Ω | 1.5 Ω– > 1.5 Ω |
| Comparison example 6 | Bismthyol II (246° C.) | None | Insoluble | None | 18 mΩ –> 121 mΩ | 18 mΩ –> 53 mΩ |

*HMFA: Hexamethylene phthalamide

Comparison of the flip chip packaging structures according to practical examples 6–10 to comparison examples 4–6 shows the following. That is, the evaluation of the ion migration resistance indicates that the time lapse up to a point in time when a current starts to flow was prolonged as compared to the case of using the prior art conductive adhesive agent (comparison example 4) so it is confirmed that the ion migration resistance was improved. Also, the evaluation of the sulfurization indicates that a ratio of a change in the connection resistance as measured before and after testing was reduced as compared to comparison example 4 so it is confirmed that the sulfurization resistance was improved.

Further, the comparison assures the following. That is, comparison between practical example 6 where the elution preventing film 5 formed on the surfaces of the conductive particle 3 is insoluble in water and an aqueous solution containing hydrogen sulfide or sulfur oxide and comparison example 7 where it is soluble in them reveals that practical example 6 came up with better ion migration resistance and sulfurization resistance. This is considered because the elution preventing film 5 formed, if it is insoluble in water and an aqueous solution containing hydrogen sulfide or sulfur oxide, is less subject to flake-off even when the water or the aqueous solution containing sulfur is condensed on the surfaces of the film.

Also, comparison between practical example 6 where the elution preventing film-forming agent 4 is added as it is into the conductive adhesive agent 1 and practical example 8 where it is added as encapsulated in a micro-capsule reveals that practical example 8 came up with a lower initial connection resistance. This is considered because when it is encapsulated in the micro-capsule, the reaction of the elution preventing film-forming agent 4 as unhardened can be more surely inhibited, thus reducing the amount of the insulating elution preventing film 5 which exists at a contact point between the conductive particles 3 or the conductive particle 3 and the electrode 13 or 21. Note here that in practical example 8 the elution preventing film-forming agent 4 which has, as its main component, anthranilic acid having a reaction temperature (activation temperature) higher than the application temperature of the conductive adhesive agent 1 is encapsulated in a micro-capsule. In this practical example 8, however, it is possible to use even such an elution preventing film-forming agent 4 that has, as its main component, a chelating agent exhibiting a reaction temperature (activation temperature) lower than the application temperature of the conductive adhesive agent 1, thus extending the range of selectable elution preventing film-forming agents (chelating agents) as compared to practical example 6.

Further, comparison between practical example 6 using the elution preventing film-forming agent 4 which becomes reactive at the hardening step of the conductive adhesive agent 1 and practical example 9 using the elution preventing film-forming agent 4 which is not reactive at that hardening step so that reaction may occur at the re-heating step reveals that practical example 9 came up with a lower initial connection resistance, almost equal to an initial value obtained in the case (comparison example 1) where the prior art conductive adhesive agent was used. This is considered because that in practical example 9 the elution preventing film 4 becomes reactive after continuity appeared at the hardening step, so that the elution preventing film 5 is formed little at a continuity site.

Also, as may be clear from practical example 10, when the elution preventing film-forming agent 4 is encapsulated in a micro-capsule in the configuration of practical example 9, almost the same ion migration resistance and sulfurization resistance can be obtained and, in addition to that, the range of selectable elution preventing film-forming agent 4 is extended. This is because practical example 9 needs to use the elution preventing film-forming agent 4 exhibiting an activation temperature higher than the hardening temperature, whereas practical example 10 can accept any reaction temperature (activation temperature) of the elution preventing film-forming agent 4 as far as the melting temperature of the micro-capsule is set higher than the hardening temperature of the binder resin 2. Although such an elution preventing film-forming agent 4 that has, as its main component, anthranilic acid having an activation temperature higher than the application temperature of the conductive adhesive agent 1 has been used in practical example 10, this practical example 10 can use such an agent 4 that has, as its main component, a chelating agent exhibiting an activation temperature lower than the application temperature of the conductive adhesive agent 1.

Note here that if the conditions described in practical examples 6–10 are not satisfied, the intended effects cannot be obtained. The evidence is given in comparison examples 5 and 6.

Comparison example 5 indicates a case of using such an elution preventing film-forming agent 4 that has, as its main component, a chelating agent having an activation temperature lower than the application temperature of the conductive adhesive agent 1. This case came up with an extremely high initial connection resistance as compared to practical example 6, that is, a case where the reaction temperature (activation temperature) of the elution preventing film is higher than the application temperature of the conductive adhesive agent 1. This is because that the elution preventing film-forming agent 4 reacts as unhardened with the conductive particle 3 to form an elution preventing film (metallic complex), so that an insulating elution preventing film (metallic complex) is present at a site related to continuity of the conductive particles 3, thus increasing the contact resistance.

Also, comparison example 6 indicates a case where the elution preventing film-forming agent 4 has a reaction temperature (activation temperature) higher than the hardening temperature of the conductive adhesive agent 1. This case came up with such a result that the ion migration resistance and the sulfurization resistance were extremely inferior as compared to practical example 5, that is, a case where the reaction temperature (activation temperature) of the elution preventing film-forming agent 4 is lower than the hardening temperature of the conductive adhesive agent 1. This is because that the elution preventing film-forming agent 4 is not reactive at the hardening step for the conductive adhesive agent 1 (binder resin 2), thus failing to form the elution preventing film 5 on the surfaces of the conductive particle 3.

Thus, practical examples 6–10 (flip chip packaging structure) also provide almost the same effects as those by practical examples 1–5 (conductive adhesive agent).

Although practical examples 6–10 have used the conductive adhesive agent 1 having a thermoplastic epoxy resin to provide electric connection between the semiconductor device and the printed-circuit board, a thermo-hardening epoxy resin may be used instead to have almost the same effects like in the case of the first embodiment.

The following will describe the practical examples of the third embodiment (chip-element packaging structure).

PRACTICAL EXAMPLE 11

This practical example provides a chip-element packaging structure which is made using a conductive adhesive agent of practical example 1. Note here that practical example 1 has used such an elution preventing film-forming agent 4 that has, as its main component, an anthranilic acid, which is an chelating agent. This chip-element packaging structure comprises a printed-circuit board (30×60 mm, thickness: 1.6 mm) 12 made of glass epoxy, on which the electrode 13 is formed by Au plating and then the 0-$\Omega$ chip resistor (3216 size, SnPb plating) 14, the chip coil (diameter: 8 mm$\phi$, height: 4 mm) 15, and the chip capacitor (3215 size, SnPb plating) 16 are packaged.

This chip-element packaging structure is made as follows. First, the conductive adhesive agent 1 is screen-printed on the electrode 13 of the printed-circuit board 12. Then, the chip elements 14, 15, and 16 are mounted on the electrode 13 using an existing element mounting machine and undergo heating in an oven at 150° C. for 30 minutes, thus hardening the conductive adhesive agent 1.

PRACTICAL EXAMPLE 12

As a feature of this practical example, the chip-element packaging structure is made up of the conductive adhesive agent 1 of practical example 2 using such an elution preventing film-forming agent 4 that has, as its main component, 1-nitroso-2-naphthol, which is a chelating agent. The configuration and the manufacturing method of the chip-element packaging structure are totally the same as those of practical example 11 except the conductive adhesive agent employed.

PRACTICAL EXAMPLE 13

As a feature of this practical example, as the elution preventing film-forming agent 4, the conductive adhesive agent, which is a chelating agent, is used and, the conductive adhesive agent of practical example 3 for encapsulation into a micro-capsule by use of hexamethylene phtalamide is used to make the chip-element packaging structure. The configuration and the manufacturing method of the chip-element packaging structure are totally the same as those of practical example 11 except the conductive adhesive agent 1 employed.

PRACTICAL EXAMPLE 14

As a feature of this practical example, as the elution preventing film-forming agent 4, the conductive adhesive agent 1 having, as its main component, the bismthyol II, which is a chelating agent, is used and then undergoes re-heating after the conductive adhesive agent is hardened according to the method of practical example 3, to constitute the chip-element packaging structure. The configuration and the manufacturing method of the chip-element packaging structure are totally the same as those of practical example 11 except the conductive adhesive agent 1 employed.

PRACTICAL EXAMPLE 15

As a feature of this practical example, as the elution preventing film-forming agent 4, such a material that has, as its main component, anthranilic acid, which is a chelating agent, and also that encapsulates this elution preventing film-forming agent 4 in a micro-capsule with a hexamethylene phtalamide resin is used and then undergoes re-heating after the conductive adhesive agent 1 is hardened according to the method of practical example 5, to form the flip chip packaging structure. The configuration and the manufacturing method of the flip chip packaging structure are totally the same as those of practical example 11 except the conductive adhesive agent 1 employed.

COMPARISON EXAMPLES 7–9

Corresponding to the above-mentioned practical examples 11–15, the chip-element packaging structures of comparison examples 7–9 are prepared.

These chip-element packaging structures are supposed to use the conductive adhesive agent of comparison example 1 and also have the same packaging constructions as those of practical examples 11–15.

Thus prepared chip-element packaging structures of practical examples 11–15 and comparison examples 7–9 are evaluated in terms of reliability according to the following method.

As flowing an in-actual-use current (10 mA) through these chip-element packaging structures, the method measured them for a change in the connection resistance in a hot and humid environment (temperature: 85° C., humidity: 85%, testing time 10000 hours), to perform evaluation and measurement of the ion migration resistance. Likewise, as flowing an in-actual-use current (10 mA) through them, the method measured them for a change in the connection resistance in a hydrogen sulfide atmosphere (temperature: 40° C., humidity: 90%, concentration of hydrogen sulfide: 3 ppm, testing time: 96 hours), to perform evaluation and measurement of the sulfurization resistance. The results are shown in Table 3.

after testing was reduced as compared to comparison example 7 so it is confirmed that the sulfurization resistance was improved.

Further, the comparison assures the following. That is, comparison between practical example 11 where the metallic complex formed on the surfaces of the conductive particle is insoluble in water and an aqueous solution containing hydrogen sulfide or sulfur oxide and comparison example 12 where it is soluble in them reveals that practical example 11 came up with better ion migration resistance and sulfurization resistance. This is considered because the elution preventing film 5 formed, if it is insoluble in water and an aqueous solution containing hydrogen sulfide or sulfur oxide, is less subject to flake-off even when the water or the aqueous solution containing sulfur is condensed on the surfaces of the film.

Also, comparison between practical example 11 where the elution preventing film-forming agent 4 is added as it is into the conductive adhesive agent 1 and practical example 13 where it is added as encapsulated in a micro-capsule reveals that practical example 13 came up with a lower initial connection resistance. This is considered because when it is encapsulated in the micro-capsule, the reaction of the elution preventing film-forming agent 4 as unhardened can be more surely inhibited, thus reducing the amount of the insulating elution preventing film (metallic complex) which exists at a

TABLE 3

| | Chelating agent (Activation temperature) | Capsule (Softening temperature) | Metallic complex Solubility | Re-heating | Migration results Initial value –> value after 1000 H | Sulfurization test results Initial value –> value after 96 H |
|---|---|---|---|---|---|---|
| Embodiment 11 | Anthranilic acid (143° C.) | None | Insoluble | None | 30 mΩ–> 30 mΩ | 30 mΩ–> 30 mΩ |
| Embodiment 12 | 1-nitroso-2-naphthaol (110° C.) | None | Soluble | None | 31 mΩ –> 35 mΩ | 31 mΩ–> 38 mΩ |
| Embodiment 13 | Anthranilic acid (143° C.) | HMFA (87° C.) | Insoluble | None | 27 mΩ –> 27 mΩ | 27 mΩ –> 27 mΩ |
| Embodiment 14 | Bismthyol II (246° C.) | None | Insoluble | 250° C. 5 min | 24 mΩ –> 24 mΩ | 24 mΩ –> 24 mΩ |
| Embodiment 15 | Anthranilic acid (143° C.) | HMFA (162° C.) | Insoluble | 170° C. 5 min | 24 mΩ–> 24 mΩ | 24 mΩ –> 24 mΩ |
| Comparison example 7 | None | None | — | None | 24 mΩ –> OPEN | 24 mΩ –> 59 mΩ |
| Comparison example 8 | Toluene-3,4-dithiol (31° C.) | None | Insoluble | None | 2.7 Ω –> 2.7 Ω | 2.7 Ω–> 2.7 Ω |
| Comparison example 9 | Bismthyol II (246° C.) | None | Insoluble | None | 25 mΩ –> 163 mΩ | 25 mΩ –> 67 mΩ |

*HMFA: Hexamethylene phthalamide

Comparison of the chip-element packaging structures according to practical examples 11–15 to comparison examples 7–9 shows the following. That is, the evaluation of the ion migration resistance indicates that the time lapse up to a point in time when a current starts to flow was prolonged as compared to the case of using the prior art conductive adhesive agent (comparison example 7) so it is confirmed that the ion migration resistance was improved. Also, the evaluation of the sulfurization indicates that a ratio of a change in the connection resistance as measured before and contact point between the conductive particles 3 or the conductive particle 3 and the electrode 21. Note here that although practical example 13 has shown the case where the elution preventing film-forming agent 4 which has, as its main component, anthranilic acid, which is a chelating agent having an activation temperature higher than the application temperature of the conductive adhesive agent 1, is encapsulated in a micro-capsule, it is possible to use even such an elution preventing film-forming agent 4 that has, as its main component, a chelating agent exhibiting an activation temperature lower than the application temperature of the conductive adhesive agent 1, thus extending the range of selectable elution preventing film-forming agents 4 (chelating agents) as compared to practical example 11.

Further, comparison between practical example 13 using the elution preventing film-forming agent 4 which becomes reactive at the hardening step of the conductive adhesive agent 1 and practical example 14 using the elution preventing film-forming agent 4 which is not reactive at that hardening step so that reaction may occur at the re-heating step reveals that practical example 14 came up with a lower initial connection resistance, almost equal to an initial value obtained in the case (comparison example 7) where the prior art conductive adhesive agent was used. This is considered because that in practical example 14 the elution preventing film 4 becomes reactive after continuity appeared at the hardening step, so that the elution preventing film 5 is formed little at a continuity site.

Also, as may be clear from practical example 15, when the elution preventing film-forming agent 4 is encapsulated in a micro-capsule in the configuration of practical example 14, almost the same ion migration resistance and sulfurization resistance can be obtained and, in addition to that, the range of selectable elution preventing film-forming agent 4 (chelating agent) is extended. This is because practical example 14 needs to use the elution preventing film-forming agent 4 which has, as its main component, a chelating agent exhibiting an activation temperature higher than the hardening temperature, whereas practical example 15 can accept any activation temperature of the elution preventing film-forming agent 4 (chelating agent) as far as the melting temperature of the micro-capsule is set higher than the hardening temperature of the binder resin 2. Although such an elution preventing film-forming agent 4 that has, as its main component, anthranilic acid having an activation temperature higher than the application temperature of the conductive adhesive agent 1 has been used in practical example 15, this practical example can use such an agent 4 that has, as its main component, a chelating agent exhibiting an activation temperature lower than the application temperature of the conductive adhesive agent 1.

Note here that if the conditions described in practical examples 11–15 are not satisfied, the intended effects cannot be obtained. The evidence is given in comparison examples 8 and 9.

Comparison example 8 indicates a case of using such an elution preventing film-forming agent 4 that a reaction temperature (activation temperature) lower than the application temperature of the conductive adhesive agent 1. This case came up with an extremely high initial connection resistance as compared to practical example 11, that is, a case where the above-mentioned reaction temperature (activation temperature) is higher than the application temperature of the conductive adhesive agent 1. This is because that the elution preventing film-forming agent 4 reacts as unhardened with the conductive particle 3 to form the elution preventing film 5, so that an insulating elution preventing film 5 (metallic complex) is present at a site related to continuity of the conductive particles 3, thus increasing the contact. resistance.

Also, comparison example 9 indicates a case where the elution preventing film-forming agent 4 has a reaction temperature (activation temperature) higher than the hardening temperature of the conductive adhesive agent 1. This case came up with such a result that the ion migration resistance and the sulfurization resistance were extremely inferior as compared to practical example 11, that is, a case where the reaction temperature (activation temperature) is lower than the hardening temperature of the binder resin 2. This is because that the elution preventing film-forming agent 4 is not reactive at the hardening step of the conductive adhesive agent 1, thus failing to form the elution preventing film 5 on the surfaces of the conductive particle 3.

Thus, practical examples 11–15 (chip-element packaging structure) also provide almost the same effects as those by practical examples 1–5 (conductive adhesive agent) and practical examples 6–10 (flip chip packaging structure).

Although practical examples 11–15 have shown only the packaging structures for chip elements as an example of the packaging structure for the elements, of course they can be used to package all the other elements including, for example, such package elements as a QFP (Quad Flat Package), CSP (Chip Scale Package), or BGA (Ball Grid Array), such chip or lead elements as an electrolytic capacitor, diode, or switch, and IC bare packages. Also, the elution preventing film-forming agent and the like are not limited in application to the above-mentioned embodiments as far as the requirements are satisfied.

In any of the above-mentioned practical examples, the elution preventing film-forming agent 4 can be added, as dispersed in a non-polar solvent, to a conductive adhesive agent. Then, the following will occur.

Since a non-polar solvent serves to inhibit the reaction of a chelating agent, if the elution preventing film-forming agent 4 is added, as dispersed in the non-polar solvent, to a conductive adhesive agent, the chelating agent is little reactive in a state where the binder resin is not. hardened yet. Then, when the binder resin is being hardened, the chelating agent reacts with a conductive particle to form an elution preventing film containing a metallic complex. Accordingly, the elution preventing film 5 is formed further less when the binder resin is not hardened yet, thus surely inhibiting a rise in the connection resistance in the conductive adhesive agent 1 after hardening. Further, since the activation temperature of the chelating agent may be lower than the application temperature of the conductive adhesive agent, the required properties (especially, activation temperature) of the chelating agent become lenient, thus extending the range of selectable chelating agents that much.

As is clear from the above-mentioned embodiments and practical examples, by the invention such a packaging structure that is excellent in the ion migration resistance and the sulfurization resistance as compared to a prior art one can be obtained.

Also, the invention, if applied to such a packaging structure as a flip chip or chip-element packaging structure, improves the insulation reliability to thereby enable reducing the connection distance such as an inter-electrode distance, thus saving on a space for the packaging structure.

Further, since the invention improves the reliability against sulfurization, it can be applied to such a product that may be used in a gas atmosphere containing a lot of sulfur, such as in the neighboring area of hot springs or in the vicinity of volcanoes, thus greatly possibly extending the application fields.

Although the invention has been described with respect to its most preferred embodiments, their combination and the arrangement can be variously changed without departing from the spirit and the scope of the accompanying claims.

What is claimed is:

1. A conductive adhesive agent comprising:

a binder resin;

a conductive particle; and an elution preventing film-forming agent,
wherein said elution preventing film-forming agent becomes reactive after electric continuity through said conductive particle appeared in the conductive adhesive agent when said binder resin is being hardened, to thereby form an elution preventing film on a surface of said conductive particle.

2. The conductive adhesive agent according to claim 1, wherein a reaction temperature of said elution preventing film-forming agent satisfies conditions of:

application temperature of conductive adhesive agent<reaction temperature of elution preventing film-forming agent; and reaction temperature of elution preventing film-forming agent≦hardening temperature of binder resin.

3. The conductive adhesive agent according to claim 1, wherein said elution preventing film-forming agent contains a chelating agent, said chelating agent becoming reactive after electric continuity through said conductive particle appeared in the conductive adhesive agent when said binder resin is being hardened, to thereby form an elution preventing film containing a metallic complex on a surface of said conductive particle.

4. The conductive adhesive agent according to claim 3, wherein an activation temperature of said chelating agent satisfies conditions of:

application temperature of conductive adhesive agent<activation temperature of chelating agent; and activation temperature of chelating agent≦hardening temperature of binder resin.

5. The conductive adhesive agent according to claim 4, wherein said elution preventing film-forming agent is encapsulated in a micro-capsule, a melting temperature of said micro-capsule and an activation temperature of a chelating agent contained in said elution preventing film-forming agent satisfying conditions of:

application temperature of conductive adhesive agent<melting temperature of micro-capsule;

melting temperature of micro-capsule≦hardening temperature of binder resin; and activation temperature of chelating agent≦hardening temperature of binder resin.

6. The conductive adhesive agent according to claim 1, wherein said elution preventing film-forming agent is made of a water-insoluble material.

7. The conductive adhesive agent according to claim 1, wherein said elution preventing film-forming agent is made of such a material that is insoluble in an aqueous solution containing hydrogen sulfide or sulfur oxide.

* * * * *